United States Patent [19]

Lonka

[11] Patent Number: 5,268,819
[45] Date of Patent: Dec. 7, 1993

[54] CIRCUIT BOARD ASSEMBLY

[75] Inventor: Pekka S. Lonka, Salo, Finland

[73] Assignee: Nokia Mobile Phones Ltd., Salo, Finland

[21] Appl. No.: 848,647

[22] Filed: Mar. 9, 1992

[30] Foreign Application Priority Data

Mar. 19, 1991 [FI] Finland .................................. 911334

[51] Int. Cl.[5] .................. H01R 23/72; H01R 9/09
[52] U.S. Cl. ............................ 361/785; 439/45;
439/75; 361/744; 361/784; 361/823
[58] Field of Search .............. 361/393, 396, 412, 413,
361/425, 426, 395, 399; 439/44, 45, 74, 75, 78,
83, 275; 174/262, 265, 266, 267

[56] References Cited

U.S. PATENT DOCUMENTS

| | | | |
|---|---|---|---|
| 4,264,114 | 4/1981 | Chandler | 339/17 |
| 4,641,426 | 2/1987 | Hartman et al. | 439/275 |
| 4,683,550 | 7/1987 | Jindrick et al. | 439/74 |
| 5,032,085 | 7/1991 | Alwine et al. | 439/79 |
| 5,145,383 | 9/1992 | Bowen et al. | 439/78 |
| 5,148,354 | 9/1992 | Roth | 361/413 |

FOREIGN PATENT DOCUMENTS

| | | | |
|---|---|---|---|
| 0397057A1 | 5/1990 | European Pat. Off. | |
| 0083476 | 4/1954 | United Kingdom | 361/426 |
| 847404 | 11/1956 | United Kingdom | |
| 1374671 | 3/1972 | United Kingdom | |

OTHER PUBLICATIONS

5-Star Connectors Catalogue, 1987, p. 181, 3M MCS Header Pin Strip.

Primary Examiner—Leo P. Picard
Assistant Examiner—D. Sparks
Attorney, Agent, or Firm—Perman & Green

[57] ABSTRACT

A printed circuit board upon which are mounted a number of electronic components is provided with a connector strip for electrically coupling the components to respective components on a second circuit board located underneath. The strip comprises a body portion and pins projecting therefrom. The pins have a stepwise configuration with a first end portion extending through apertures in the upper circuit board and connected to a second connector strip on the second circuit board, a second end portion extending through the body portion, and a middle portion which abuts the surface of the upper circuit board and by which the strip is connected to the upper circuit board by means of a solder joint. Components on the upper circuit board are electrically coupled by means of tracks which are connected to the components at one end by a solder joint and at the other end by a solder joint, via pins, to the second connector strip and tracks on the lower circuit board.

6 Claims, 1 Drawing Sheet

CIRCUIT BOARD ASSEMBLY

This invention relates to a circuit board assembly comprising a coupling means for coupling components mounted on a first circuit board to respective components mounted on a second circuit board.

BACKGROUND OF THE INVENTION

In an electronic device, such as a car telephone, the coupling between two circuit boards arranged one above the other is intended to form an electrical coupling between the individual components such as transistors, resistors and integrated circuits on the boards. The coupling can be effected, for instance, from a component on the upper circuit board along a conductive track on the surface of the board to a soldering spot, from there via the metal forming the solder joint to a pin of a connector strip, then to the counterpart connector attached to the lower circuit board, and finally from there along a track on the surface of the lower circuit board to a component on the other board.

The connector strip typically comprises a strip or block-like body part and a number of pins projecting from the body part in a comb-like manner. The upper circuit board is provided with openings aligned with the pins, through which the pins are pushed into bores or the like on a counterpart connector provided on the lower circuit board. The securing of the connector strip is effected by soldering the pins, on the underside of the upper circuit board, to the said openings on the board.

Using this connector strip is inconvenient and time consuming due to the fact that although it is possible to secure the components to the circuit boards by mechanical soldering techniques such as flow soldering or reflow soldering techniques, it is necessary to carry out the soldering of the pins to the openings individually by hand. The only mechanical soldering method that could possibly be used in securing the present connector strips is robot soldering which is out of the question because it is too slow.

SUMMARY OF THE INVENTION

According to the present invention there is provided a circuit board assembly comprising a first circuit board for mounting components thereon and including means for coupling selected areas of the components to respective components mounted on a second circuit board located substantially underneath the circuit board, the coupling means comprising a body portion having a multiplicity of pins projecting therefrom, the first circuit board having a multiplicity of apertures therein arranged to receive the pins such that each aperture receives a respective one of the pins, and the pins having a substantially stepwise configuration such that, when the pins are received in the apertures, the body portion is located at a position laterally remote from the apertures.

A circuit board assembly in accordance with the invention has the advantage that the coupling between components on first and second circuit boards is compatible with automated techniques.

Preferably, each pin is configured to have a middle portion with first and second end portions extending in a substantially perpendicular direction from either end of the lateral portion, the first end portions being received in the apertures in the first circuit board, and the second end portions are mounted within the body portion of the coupling means. The coupling means may be fastened to the first circuit board by means of a solder joint at the middle portions of one or more of the pins and components are electrically coupled to components on the lower circuit board by means of leads connected at one end to the components, and, at the other end, to the solder joint. The solder joint is provided on the same surface of the first circuit board on which the components are mounted. Thus, it is possible to solder both the components and the connector strip mechanically in such a way that the troublesome soldering by hand is avoided. Securing of both the components, such as resistors or integrated circuits, and the connector strip to the circuit board can be effected by one and the same soldering method, for instance, by the reflow method which uses solder paste. All the solders on the circuit board are preferably provided simultaneously on the same side of the board. Thus the work is fast and effective, while the need for different soldering devices is decreased, resulting in considerable cost savings.

In accordance with the invention, the pins of the connector strip preferably comprise folds forming an angle of substantially 90°, whereby the pins can be pushed up to the folds thereof to the openings on the upper circuit board in such a way that the tips of the pins project through the openings to a counterpart connector present on the second circuit board. Thus the middle portion of each pin abuts the first circuit board facilitating automated soldering techniques. After this fitting phase, the soldering of the pins is carried out adjacent the folds to the upper surface of the first circuit board.

BRIEF DESCRIPTION OF THE DRAWINGS

An embodiment of the invention will now be described, by way of example only, with reference to the accompanying drawing of which.

DETAILED DESCRIPTION OF THE INVENTION

Figure 1:
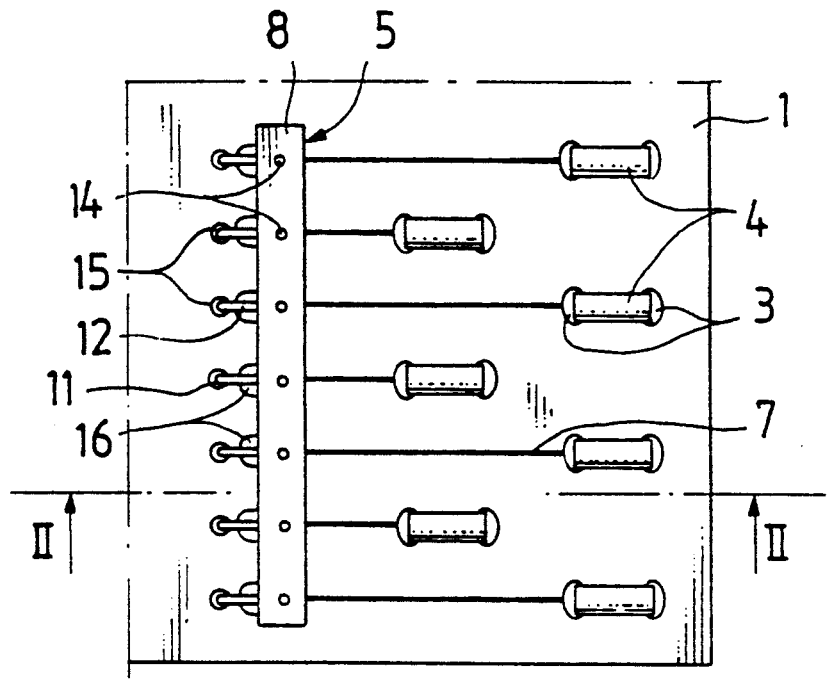
FIG. 1 is a plan view of an upper circuit board of an electronic device according to the invention.
Figure 2:
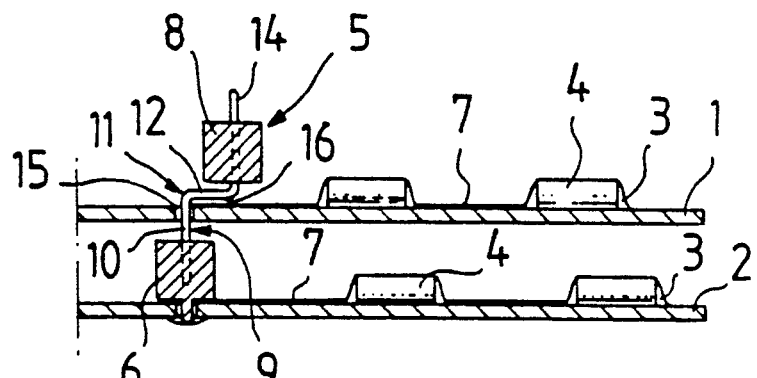
FIG. 2 shows two circuit boards one above the other intercoupled by a connector strip, section II—II of FIG. 1.

The assembly shown in FIGS. 1 and 2, which can be included in a car telephone, for instance, is formed of two circuit boards 1, 2 arranged one above the other and has electronic components 4 attached thereto with the aid of soldered joints 3, the components being, for instance, transistors, resistors or integrated circuits. Circuit boards 1, 2 are interconnected by a connector strip 5 which, together with its counterpart 6 provided on the lower circuit board 2 and conductive tracks 7 along the surfaces of the two boards 1, 2 provide the desired connections between components 4 on the different boards 1, 2.

Figure 3:
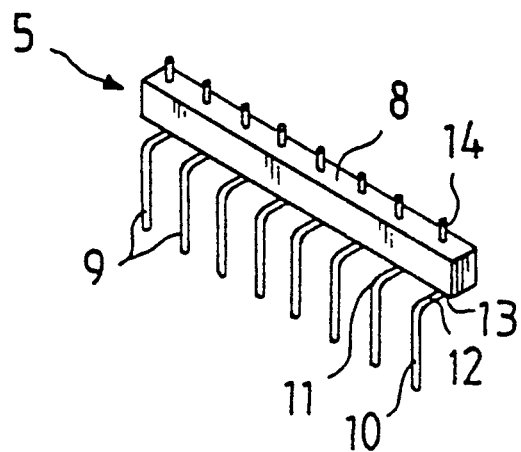
FIG. 3 shows the connector strip used in the coupling according to FIG. 2.

The construction of connector strips 5 is best shown in FIG. 3. Connector strip 5 comprises a straight, block-like body part 8 and a number of parallel pins 9 projecting therefrom. Pins 9 are bent stepwise so that each pin 9 comprises a straight tip part 10, fold 11 where the pin is bent through an angle of 90°, middle part 12 following the fold 11, another fold 13 at which the pin 9 is again bent through 90° and a butt part 14 following this and passing through in direction substantially parallel to the tip part 10, the block-like body 8 of the connector strip 5.

The intercoupling between the two circuit boards 1, 2 according to FIG. 2 is achieved by pushing tip parts 10 of pins 9 of connector strip 5 into the openings 15 on upper circuit board 1 as far as the folds 11 whereby the tips 10 of the pins 9 located in corresponding bores provided in the counterpart strip 6 provided on the lower circuit board 2. Connector 6 is a receptacle PCB (Printed Circuit Board) connector. The connector 6 has a number of pins. One end of each pin is provided with an open bore which is arranged to receive the tip end 10 of the pin 9 extending from connector strips. The other end of each pin in the connector 6 is soldered to the lower board 2 to make the connection with lead 7 on the lower board.

Middle parts 12 of respective pins 9 abut the surface of upper circuit board 1 and each pin 9 is, with regards to this middle part 12 lying in a direction substantially parallel to the surface of the board. These middle parts 12 are secured to the board 1 by soldering 16 essentially corresponding to solderings 3 by which electric components 4 are secured to the circuit boards. The soldering 16 thus forms a part of the electrical contact by which an individual component 4 on the upper circuit board 1 is electrically coupled to a component on the lower board i.e. via lead 7, pin 9 included in the connector strip 5, connector 6 and lead 7 on the lower circuit board 2.

It is preferable to form soldering 16 and soldering 3 during one stage of operation by, for instance, using the reflow soldering technique. In this method a mask or a similar protecting film provided with openings is placed on circuit board 1, and solder paste including metal, such as tin mixed with the solder is applied to the film. When the protecting film is removed after this, some solder paste is left on the circuit board on the openings of the film, i.e. on the desired soldering spots. After this, components 4 and connector strip 5 are placed on the circuit board in such a way that the adhesion of the soldering paste initially fixes them in place. After this, the circuit board is placed in a kiln heated by hot air or infrared radiation, the metal included in the solder paste melts while the other components of the paste burn off. While solidifying, the metal forms solder joints 3, 16 finally securing the components and the connector strip in place.

In view of the foregoing description, it will be evident to a person skilled in the art that various modifications may be made within the scope of the present invention.

I claim:

1. A circuit board assembly comprising a first circuit board for mounting components thereon and a second circuit board, said first circuit board including means for coupling selected areas of the components to respective components mounted on said second circuit board, said second circuit board located substantially underneath the first circuit board in the manner of a stack, the coupling means comprising a body portion having a plurality of pins projecting therefrom, the first circuit board having a plurality of apertures arranged to receive the pins such that each aperture receives a respective one of the pins, and the pins having a substantially stepwise configuration such that, when the pins are received in the apertures, said pins are enabled to connect to conductive means on said second circuit board and the body portion is located at a position laterally remote from the apertures at a position separated from said second circuit board by said first circuit board.

2. A circuit board assembly according to claim 1 wherein each pin has a middle portion and first and second portions extending respectively from each end of the middle portion in a direction substantially perpendicular to the middle portion, the first end portion being received in the apertures in the first circuit board, and the second end portion being mounted within the body portion of the coupling means.

3. A circuit board assembly as claimed in claim 2, wherein the middle portion of each pin abuts the first circuit board.

4. A circuit board according to claim 2 wherein the coupling means is fastened to the printed circuit board by a solder joint at the middle portion of one or more of the pins.

5. A circuit board assembly according to claim 4 wherein a component on the first circuit board is electrically coupled to the respective one of the components mounted on the second circuit board by means of a conductive track on said first circuit board, the conductive track being connected at one end to the component on the first circuit board and, at its other end, to a respective one of the pins by a respective solder joint.

6. A circuit board assembly according to claim 1 wherein said conductive means is a counterpart connector block mounted on the second circuit board and adapted to receive the pins extending from the coupling means.

* * * * *